(12) United States Patent
Klein et al.

(10) Patent No.: US 12,455,506 B2
(45) Date of Patent: Oct. 28, 2025

(54) PROCESS AND APPARATUS FOR FEEDING A FLEXOGRAPHIC PRINTING PLATE PROCESSOR

(71) Applicant: Esko-Graphics Imaging GmbH, Itzehoe (DE)

(72) Inventors: Thomas Klein, Wolfenbuettel (DE); Pascal Thomas, Hamburg (DE); Wolfgang Sievers, Kremperheide (DE)

(73) Assignee: Esko-Graphics Imaging GmbH, Itzehoe (DE)

(*) Notice: Subject to any disclaimer, the term of this patent is extended or adjusted under 35 U.S.C. 154(b) by 200 days.

(21) Appl. No.: 18/270,292

(22) PCT Filed: Dec. 23, 2021

(86) PCT No.: PCT/EP2021/087442
§ 371 (c)(1),
(2) Date: Jun. 29, 2023

(87) PCT Pub. No.: WO2022/144291
PCT Pub. Date: Jul. 7, 2022

(65) Prior Publication Data
US 2024/0118623 A1      Apr. 11, 2024

Related U.S. Application Data

(60) Provisional application No. 63/132,029, filed on Dec. 30, 2020.

(51) Int. Cl.
*G03F 7/20* (2006.01)
*G03F 7/00* (2006.01)
*G03F 7/16* (2006.01)

(52) U.S. Cl.
CPC ............ *G03F 7/2055* (2013.01); *G03F 7/168* (2013.01); *G03F 7/2037* (2013.01);
(Continued)

(58) Field of Classification Search
CPC ....................................................... G03F 7/20
See application file for complete search history.

(56) References Cited

U.S. PATENT DOCUMENTS

| 6,049,745 A | 4/2000 | Douglas et al. |
| 6,981,447 B2 | 1/2006 | Klein et al. |

(Continued)

FOREIGN PATENT DOCUMENTS

| CN | 210191682 U | 3/2020 |
| CN | 211109591 U | 7/2020 |

(Continued)

OTHER PUBLICATIONS

Extended European Search Report issued Feb. 13, 2025, by the European Patent Office in corresponding European Patent Application No. 24193461.1-1211. (13 pages).

(Continued)

*Primary Examiner* — Chanceity N Robinson
(74) *Attorney, Agent, or Firm* — Buchanan Ingersoll & Rooney PC

(57) ABSTRACT

A plate processing line and methods for producing a flexographic printing plate. An imaging station applies image information to a first plate. A first exposure station cures the first plate. One or more of water, a solvent, and/or a thermal process is further applied to the first plate. A drying station or an after-exposure station is configured to expose the plate to further radiation. A feeding station is configured to feed the first plate cured by the exposure station and a second plate cured by a second exposure station to the processing station. A transportation cart may transport the plate between the first or second exposure stations and the processing station.

23 Claims, 5 Drawing Sheets

(52) U.S. Cl.
CPC ...... *G03F 7/70725* (2013.01); *G03F 7/70833* (2013.01); *G03F 7/7085* (2013.01)

(56) References Cited

U.S. PATENT DOCUMENTS

| | | | |
|---|---|---|---|
| 10,691,021 | B2 | 6/2020 | Dietz et al. |
| 10,732,507 | B2 | 8/2020 | Wolterink et al. |
| 2018/0148295 | A1* | 5/2018 | Grossmann .......... B65H 29/683 |
| 2018/0217502 | A1* | 8/2018 | Dietz .................... G03F 7/3057 |
| 2019/0022994 | A1* | 1/2019 | Schadebrodt ............. G03F 7/36 |
| 2022/0055393 | A1 | 2/2022 | Diekmann et al. |

FOREIGN PATENT DOCUMENTS

| | | | | |
|---|---|---|---|---|
| DE | 20 2007 011 576 U1 | 10/2007 | | |
| EP | 0889365 A1 | 1/1999 | | |
| EP | 2 385 435 A1 | 11/2011 | | |
| EP | 3401734 A1 * | 11/2018 | ............. | B41F 27/14 |
| JP | H05-346823 A | 12/1993 | | |
| WO | 2019/089923 A1 | 5/2019 | | |
| WO | WO-2020229054 A1 * | 11/2020 | .......... | B41F 27/1206 |

OTHER PUBLICATIONS

International Search Report and Written Opinion for International Application No. PCT/EP2021/087442, dated Apr. 26, 2022, 16 pages.

* cited by examiner

PROCESS AND APPARATUS FOR FEEDING A FLEXOGRAPHIC PRINTING PLATE PROCESSOR

CROSS-REFERENCE TO RELATED APPLICATIONS

This application is a U.S. National Phase Patent Application of International Application No. PCT/EP2021/087442, filed Dec. 23, 2021, which claims priority to U.S. Provisional Patent Application No. 63/132,029, filed Dec. 30, 2020. The disclosure of each of these applications is incorporated herein by reference in its entirety for all purposes.

BACKGROUND OF THE INVENTION

Many processes are known in the art for preparing polymer printing plates, such as photopolymer flexographic plates and letterpress printing plates coated with photopolymer material. Since the beginning of flexographic printing with polymer plates, automated movement of the plates has been used for the transport of polymer plates through the various processing steps, as well as inside the washing processor. A typical process workflow includes portions in which plates are moved from an imaging station to a photopolymer curing (e.g. UV exposure) station to a plate washing/processing station. Early systems used conveyor belts for transport from the curing station to the processing station. In some current systems, holes are punched into the plate at one side to fix the plate to a bar with pins that stick into the holes in the plate. The bar with the plate attached is then dragged through subsequent stages of the process.

In recent years, automation has become increasingly important to the manufacture of flexographic printing plates. While steps of the manufacturing process are executed on self-sustaining process stations, the transportation of the plates between stations is largely controlled by human operators. Several approaches have been made to automate plate transport through all stations in the process chain. A particularly suitable transport system is disclosed in U.S. patent application Ser. No. 15/734,434, the contents of which are incorporated herein by reference in their entirety.

Known approaches at automating transport have resulted in linear arrangements where all process stations are lined up in a row and the plates are processed in a first-in, first-out mode. One such approach is disclosed in U.S. Pat. No. 10,691,021.

FIG. 1 depicts one such arrangement 100 in schematic view. Element 110 represents a loading table or a plate reservoir that supplies fresh plates. Element 120 represents an imaging station that is configured to put image information into the mask by ablating the Laser Ablated Mask (LAMS) layer of the digital polymer printing plate. Element 130 represents an exposure station configured to expose the imaged plate to radiation, e.g., ultraviolet (UV) radiation using an UV LED light source 132. Element 131 represents a plate handler—a robot that moves plates from reservoir 110 to imaging station 120, and imaged plates from imaging station 120 to exposure station 130. Element 150 represents a processing station where non-cured portions of the polymer are removed from the plate. Conventionally, processing station 150 may also include a punching station where holes are punched into one edge of the plate, for attaching the plate to a bar that pulls the plate through processing station 150. The processing itself may involve either a solvent or a thermal process. Solvents used may be either water or hydrocarbon-based. Element 160 represents an optional drying station where the residue of solvent is removed from the plate. Element 161 represents an output area where completely processed plates are stacked and can be removed, e.g., to be cut into patches for mounting on printing cylinders.

One problem with the above-described processing line is that the imaging station 120 and exposure station 130 usually have a lower throughput compared to the processing system 150 and drying station 160, as a result of which the processing station 150 may remain idle for more than 50% of the time. In other words, the combination of the imaging station 120 and exposure station 130 may represent a bottleneck in this processing line 100. Accordingly, there is a need in the art for improved systems for plate transport in a process workflow.

SUMMARY OF THE INVENTION

One aspect of the invention relates to a plate processing line for producing a flexographic printing plate. The plate processing line includes an imaging station configured to apply image information to a first plate; a first exposure station configured to expose the first plate to radiation to cure the first plate; and a processing station configured to process the plate by applying one or more of water, a solvent, and/or a thermal process to the first plate. At least one further station is selected from a group consisting of a drying station configured to dry the plate and an after-exposure station configured to expose the plate to further radiation. A feeding station is configured to feed the first plate cured by the exposure station to the processing station, wherein the feeding station is further configured to feed a second plate cured by a second exposure station to the processing station. The feeding station may be configured to accept printing plates from two or more exposure stations. The two or more imaging and exposure stations may be configured to handle different plate sizes. In embodiments, the feeding station may include one or more conveyer belts configured to transport the plate between the first exposure station and the processing station; one or more robotic arms configured to transport the plate between the first exposure station and the processing station; one or more transportation carts configured to transport the plate between the first exposure station and the processing station; or a combination thereof. In some embodiments, a first robotic system (e.g. using suction cups) may be used for transporting the plate from the exposure station and orienting it relative to a punching station, and a second robotic system (e.g. using a bar inserted in the punched holes in the plate) may be used for transporting the plate the remainder of the distance to the processing station.

Another aspect of the invention relates to a transportation cart for use in a plate processing line for producing a flexographic printing plate. The transportation cart includes a transport system for moving the transportation cart between a first exposure station, a second exposure station, and a processing station of the plate processing line. The transportation cart is configured to: (a) receive a first plate from the first exposure station and deliver the first plate to the processing station, and (b) receive a second plate from the second exposure station and deliver the second plate to the processing station. The transport system may include one or more of track wheels configured to engage corresponding rails; radio frequency sensors configured to detect radio frequency signals for navigation; and optical sensors configured to detect visual signals for navigation.

Yet another aspect of the invention relates to plate processing line for is producing a flexographic printing plate, the processing line including an imaging station configured to apply image information to the plate; a first exposure station configured to expose the plate to radiation to cure the plate; a processing station configured to process the plate by applying one or more of water, a solvent, and/or a thermal process to the plate; and at least one further station selected from a group consisting of a drying station configured to dry the plate and an after-exposure station configured to expose the plate to further radiation. Plate transportation means are configured to transport the plate between respective ones of the stations. A central computer is in communication with each of the stations and the plate transportation means, and is configured to coordinate operation of each of the stations and the transportation means to effect the producing of the flexographic printing plate. The central computer is configured to control the plate transportation means to group printing plates having a same thickness in sequence with one another, in order to expedite processing. The plate processing line may include at least one plate reservoir, and the plate transportation means may be configured to transport plates from the plate reservoir to the imaging station. More than two imaging stations may be configured to supply at least two processing stations.

Still another aspect of the invention may be a plate processing method for producing a flexographic printing plate. The method includes the steps of applying image information to a first plate; exposing the plate to radiation to cure the first plate at a first exposure station; feeding the first plate from the first exposure station to a processing station; processing the first plate at the processing station by applying one or more of water, a solvent, and/or a thermal process to the first plate; exposing a second plate to radiation to cure the second plate at a second exposure station during the processing of the first plate at the processing station; feeding the second plate from the second exposure station to the processing station following the processing of the first plate; and processing the second plate at the processing station by applying one or more of water, the solvent, and/or the thermal process to the second plate. The first plate and the second plate may have a same size and surface area.

Yet another aspect of the invention relates to a plate processing method for producing a flexographic printing plate. The method comprising the sequential steps of: a) applying image information to a first plate at a first imaging station; b) exposing the first plate to radiation to cure the first plate at a first exposure station; c) processing the first plate by applying one or more of water, a solvent, and/or a thermal process to the first plate at a first processing station; d) drying the first plate, exposing the first plate to further is radiation, or a combination thereof at one or more further stations; and e) feeding a second plate cured by a second exposure station to the first processing station. The step of feeding the second plate may comprise manually or automatically feeding the second plate. The method may further comprise feeding a third plate cured by the first exposure station to a second processing station. The second plate may have a different size, thickness, or a combination thereof. The method may include distributing a print job between the first plate and the second plate to minimize a wasted amount of plate surface (e.g. that must be cut off from a larger format polymer plate to provide a printing plate of desired size, or that does not belong to a plate patch, such as for use in a corrugated workflow). The method may include processing a plurality of jobs on a plurality of plates of a same size, including at least one plate having a higher priority job than at least one other job on at least one other plate, including processing the plate with the at least one higher priority job before of the at least one other plate with the at least one other job. At least one lower priority job may be combined with the higher priority job on the same plate to minimize plate waste.

DETAILED DESCRIPTION OF THE INVENTION

The processing lines, systems, and methods described herein generally relate to the transport and processing of flexographic photopolymer plates. It will be understood, is however, that the disclosed embodiments may be used for the transport and processing of other materials or substrates, and that suitable stations may be modified or substituted based on the processing requirements of those substrates.

The photopolymer plates are generally described herein as lying on a flat horizontal support surface as they proceed from one production station to the next. It will be understood, however, that the disclosed embodiments may be used for plates that are transported and processed in other orientations, such as hanging in a vertical orientation.

Figure 1:
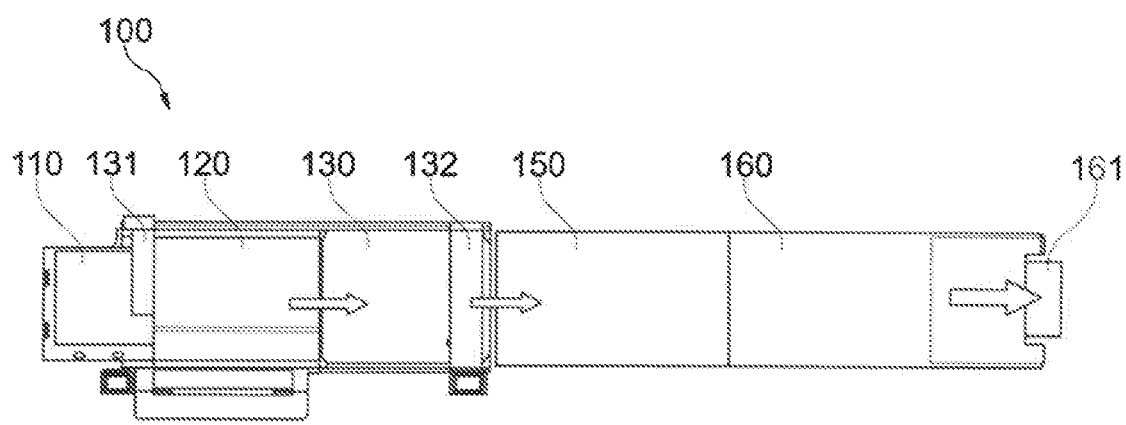
FIG. 1 is a schematic drawing depicting an example of a conventional plate processing line.
Figure 2:
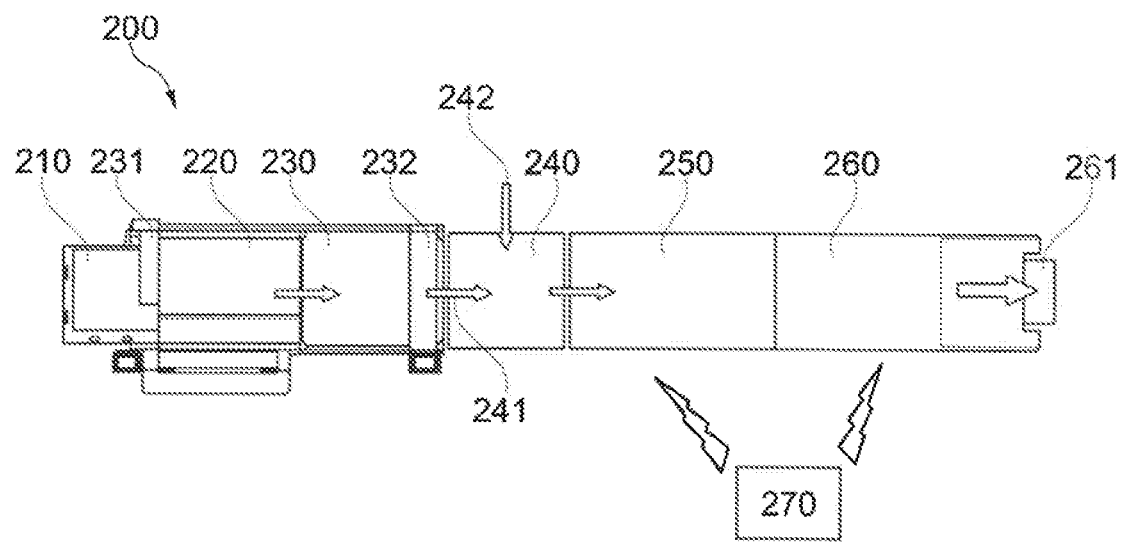
FIG. 2 is a schematic drawing depicting an example of another plate processing line.

An example plate processing line 200 for producing a flexographic printing plate is shown schematically in FIG. 2. Processing line 200 includes an imaging station 220, an exposure station 230, a feeding station 240, and a processing station 250. Additional details of processing line 200 are set forth below.

Processing line 200 may include a loading table or plate reservoir 210. As is well known in the art, the printing plates processed in processing line 200 comprises a photosensitive polymer activated by exposure to radiation. The printing plates have a front side with a mask for defining an image to be printed, i.e., by defining portions of the plate that are masked from radiation exposure relative to portions of the plate that are desired to receive such exposure. Plate reservoir 210 includes a plurality of fresh, un-imaged printing plates for imaging and curing in processing line 200. In plate reservoir 210, the plates may be stored with cover sheets or protection already peeled-off/removed, and ready for imaging. Suitable structures for storing printing plates or loading printing plates into processing line 200 will be known from the description herein. One particularly suitable storage is disclosed in U.S. Pat. No. 6,981,447, titled "METHOD AND APPARATUS FOR LOADING AND UNLOADING FLEXOGRAPHIC PLATES FOR COMPUTER-TO-PLATE IMAGING," assigned to the common assignee of this application, and incorporated herein by reference in its entirety.

Imaging station 220 is configured to apply image information to the printing plate. In an example, imaging station 220 is configured to apply image information by ablating a Laser Ablated Mask (LAMS) layer of the printing plate to create a desired image in the mask. Suitable imagers for use as imaging station 220 will be known from the description herein.

Exposure station 230 is configured to expose the printing plate to radiation to is cure the plate. In an example, exposure station 230 includes a UV LED light source 232 for irradiating the imaged side of the printing plate to cure the plate. Particularly suitable exposure apparatus for use as exposure station 230 are shown and described in U.S. Pat. No. 10,732,507, incorporated herein by reference. Other suitable exposure apparatus for use as exposure station 230 will be known from the description herein.

Processing line 200 may further include plate transportation means configured to transport the plate between respective ones of the stations. In one example, the plate transportation means may include a plate handler 231 that moves un-imaged plates from plate reservoir 210 to imaging station 220, and that moves imaged plates from imaging station 220 to exposure station 230. In an example, plate handler 231 may include suction cups configured to grab and slightly lift the plates. Plate handler 231 may further include a blower or an air compressor configured to blow air between the plates and an underlying support surface, in order to create an air cushion that reduces friction between the plate and the support surface and allows the suction cups to move plates between stations. Suitable plate transportation means for use in processing line 200 disclosed in U.S. patent application Ser. No. 15/734,434, titled TRANSPORT SYSTEM AND METHOD FOR PRINTING PLATES, assigned to the common assignee of this application, and incorporated herein by reference in its entirety.

Alternatively, the plate transportation means may include one or more plate transport carts, such as but not limited to those described in U.S. patent application Ser. No. 15/734, 434, and/or as described in further detail herein. Plate transport cart(s) may be used to supply imaging station 220 with plates from plate reservoir 210. In one example, plates at loading table or plate reservoir 210 may still be in their original box or case, with cover sheets and foam separation sheets. In this example, plate transportation means may include a robotic arm configured to remove the foam sheet and the cover sheet, and pull the plate by means of suction cups onto the transport cart, or directly onto imaging station 220.

Processing station 250 is configured to process the cured printing plates. At processing station 250, printing plates cured by exposure station 230 are processed to remove the non-cured portions of the polymer from the plate. In one example, the non-cured portions of the printing plate may be removed by applying a solvent wash to the printing plate. Solvents used may be either water or hydrocarbon-based. In another is example, the non-cured portions of the printing plate may be removed by applying a thermal process to the printing plate. Suitable washing or thermal processes for implementation at processing station 250 will be known from the description herein.

Processing line 200 may include at least one further station 260 downstream from processing station 250. In one example, the further station 260 is a drying station configured to dry the processed printing plate. In this example, the drying station is configured to remove any residue of solvent from processing station 250 from the plate. It will be understood, however, that a drying station may be unnecessary where processing station 250 applies a thermal process to the printing plate. In another example, the further station 260 is another exposure station configured to expose the printing plate to further radiation. Configured an exposure station, further station 260 may include any of the features of exposure station 230.

After drying or further exposure, the printing plate may be transported to an output area 261, where fully processed plates are stacked and can be removed, e.g., to be cut into patches for mounting on printing cylinders.

Feeding station 240 is configured to feed the printing plate cured by exposure station 230 to processing station 250. Moreover, feeding station 240 is further configured to feed another printing plate, cured by another exposure station, to processing station 250. Feeding station 240 may be configured to accept printing plates from two or more exposure stations 230. To this end, processing line 200 may include multiple distinct versions of certain stations, such as multiple plate reservoirs 210, multiple imaging stations 220, and multiple exposure stations 230. Alternatively, feeding station 240 may be configured to receive printing plates from exposure stations of other processing lines, and feed those plates to processing station 250.

Feeding station 240 may operate manually, automatically, or may combine both manual and automatic feeding. In one example, a first group of plates is automatically fed from exposure station 230 by plate handler 231 to feeding station 240, as shown diagrammatically in FIG. 2 by arrow 241. In this example, a second group of plates is manually fed intermittently with the first group from another exposure station (not shown) to feeding station 240, as shown diagrammatically in FIG. 2 by arrow 242. The manually fed second group of plates may be fed from a different side of feeding station 240 as the automatically fed first group of plates, as indicated by arrows 241 and 242.

In one example, feeding station 240 comprises one or more conveyer belts. The conveyer belts can receive printing plates from multiple different exposure stations 230 (e.g., delivered by multiple different plate handlers 231). The conveyer belts are configured to then transport each of the received plates from their respective exposure station 230 to printing station 250.

In another example, feeding station 240 comprises one or more robotic arms. The robotic arms can remove printing plates from respective different exposure stations 230, and then transport the printing plates from their respective exposure station 230 to printing station 250. In embodiments employing a punching station for disposing holes in the plate, and attaching a bar to the plate for manipulation by robotic arms, the punching station that punches the plate and attaches the bar to the plate may be positioned after the UV exposure. After curing, the plates are less sensitive to handling and may thus be moved by the robotic arm dragging the plate to the processing station using the bar with less risk of damage. Robotic handlers, such as those described in U.S. Ser. No. 15/734,434, using suction cups may also be provided, as well as combinations of handling systems including suction cups in one portion of the transport system and bar-based handlers for another portion of the transport system.

In yet another example, feeding station 240 comprises one or more transportation carts. The transportation carts can receive printing plates from multiple different exposure stations 230 (e.g., delivered by multiple different plate handlers 231 or robotic arms). The transportation carts are configured to then transport each of the received plates from their respective exposure station 230 to printing station 250.

It will be understood that, for certain printing plates or processing lines, that the system may comprise fewer than all of the above stations. Likewise, it will be understood that the various plate transport means described above may be configured to transport plates to any station along the processing line, without the requirement that plates be transported sequentially through each station.

Processing line 200 may further include a central computer 270. Central computer 270 is in communication with one or more of stations 220, 230, 240, 250, 260, and may further be in communication with plate handler 231. Central computer 270 may communicate by wired or wireless communication with the above components of processing line 200. Central computer 270 is configured to send signals to the above components of processing line 200 in order to coordinate operation of stations 220, 230, 240, 250, 260, and to coordinate the operation of plate handler 231 to transport plates between the above is stations, in order to effect the efficient and expedient production of flexographic printing plates by processing line 200.

Central computer 270 may include one or more processing components such as microprocessors, microcontrollers, etc., as would be well known in the art. Central computer 270 may further coordinate the operations of stations 220, 230, 240, 250, 260 through one or more distributed or remote computing components assigned to or integrated with the respective stations. Central computer 270 may operate in a fully automated manner, such that no human operator is required to control the order or processing of plates. In embodiments, the controller may also be configured to process plates identified as having a higher priority delivery than other plates. The controller may further be configured to combine high priority jobs with other lower priority jobs on the same plate type to minimize waste (e.g. of full format plates). For example, in one embodiment, in which multiple printing plates of a desired size for printing fit on a full-format polymer plate, e.g. for use a flexible packaging printing workflow, multiple smaller-sized plates may be consolidated onto a full format plate to minimize area on the full-format plate that does not belong to a finished printing plate. In another embodiment, such as when plate patches are used on a carrier sheet, e.g. for use in a corrugated printing workflow, the controller may be configured to combine high priority plate patches with lower priority plate patches on the same full-format plate to minimize waste that does not belong to a patch.

In one example, central computer 270 is configured to control plate handler 231 to group printing plates having a same thickness in sequence with one another. Plate handler 231 may withdraw plates from plate reservoir 210 such that plates having the same thickness are imaged at imaging station 220 and cured at exposure station 230 in sequence, such that processing station 250 is fed a sequence of plates having the same thickness. Providing plates having the same thickness to processing station 250 may expedite processing by processing line 200 by producing common and consistent processing times at each of the stations of processing line 200.

Figure 3:
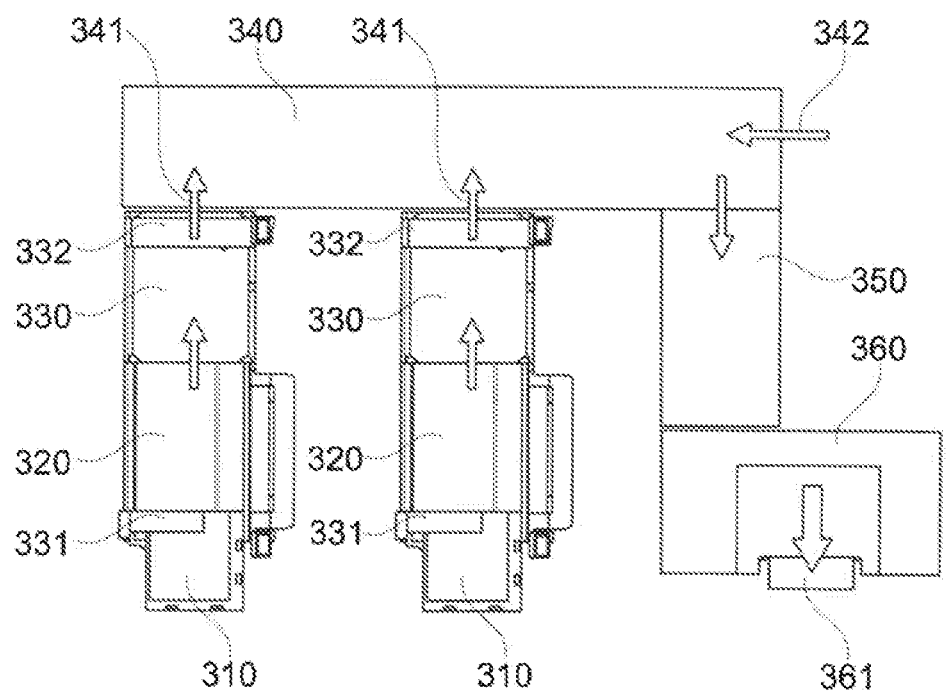
FIG. 3 is a schematic drawing depicting an example of yet another plate processing line.

Another example plate processing line 300 for producing a flexographic printing plate is shown schematically in FIG. 3. Processing line 300 includes multiple imaging stations 320, multiple exposure stations 330, a feeding station 340, and a processing station 350. Processing line 300 may include any of the features of processing line 200 described above. Additional details of processing line 300 are set forth below.

Processing line 300 may include multiple loading tables or plate reservoirs 310, as shown in FIG. 3. In this example, each imaging station 320 obtains un-imaged plates from its own respective plate reservoir 310. Alternatively, processing line 300 may include a single common loading table or plate reservoir which can serve as a source of un-imaged plates for multiple imaging stations 320.

Imaging stations 320 may be configured to image plates having the same size and/or thickness, in order to result in a sequence of plates being fed by feeding station 340 to processing station 350 with a same size or thickness. Alternatively, one or more of the imaging stations 320 may be configured to image plates having a different size than at least one other imaging station. In this example, plate transportation means may be controlled to feed plates to a particular imaging station 320 based on the size of the plate, in order to reduce plate waste. In embodiments, different imaging stations may be configured to image different plate formats (e.g. sizes) such that, depending on the size of the plate to be used for printing or the collective area of plate patches to be produced, the plate size can be selected optimally to minimize plate waste.

Exposure stations 330 are configured to expose the printing plates of respective imaging stations 320 to radiation from respective light sources 332 for curing. As with imaging stations 320, exposure stations 330 may be configured for curing plates having a same size or different sizes, depending on the associated imaging station 320.

Processing line 300 may further include plate transportation means configured to transport plates between respective ones of the stations. In one example, the plate transportation means may include multiple plate handlers 331 that moves un-imaged plates from each plate reservoir 310 to a respective imaging station 320, and that transports imaged plates from respective imaging station 320 to a corresponding exposure station 330. Alternatively, processing line 300 may include a single common plate handler operable to transport plates from one or more plate reservoirs to the multiple imaging stations 320, and to transport imaged plates from respective imaging station 320 to a corresponding exposure station 330.

Processing line 300 may include at least one further station 360 downstream from processing station 350. As set forth above, the further station 360 may be a drying station or another exposure station or a combination thereof. After drying or further exposure, the printing plate may be transported to an output area 361, where fully processed plates are stacked and can be removed, e.g., to be cut into patches for mounting is on printing cylinders.

Feeding station 340 is configured to feed the printing plates cured by exposure stations 330 to processing station 350. While two sets of imaging stations 320 and exposure stations 330 are shown in FIG. 3, it will be understood that processing line 300 may include any number of imaging/exposure station sets, all of which can deliver cured plates to feeding station 340, based on the relative timing and capacity of processing station 350. It will be understood that the time required for plate processing is depending the type of processing and plate parameters like thickness, size, type of polymer, and floor thickness. FIG. 3 illustrates one potential configuration allowing for more than two imaging/exposure station sets, providing for a potential third set or a manual feeding location at arrow 342. In other configurations, three or more exposure/imager combinations may be configured such that each combination supplies two or more processing stations. In practice, any number of exposure/imager combinations may feed any number of processing stations.

Feeding station 340 may operate manually, automatically, or may combine both manual and automatic feeding. In one example, a first group of plates is automatically fed to feeding station 340 from one exposure station 330 by one plate handler 331, and a second group of plates is automatically fed to feeding station 340 intermittently with the first group from another exposure station 330 by another plate handler 331, as shown diagrammatically in FIG. 3 by arrows 341. Both groups of plates may be fed from the same side of feeding station 340 as shown in FIG. 3, or may be fed from different or opposite sides.

Figure 4:
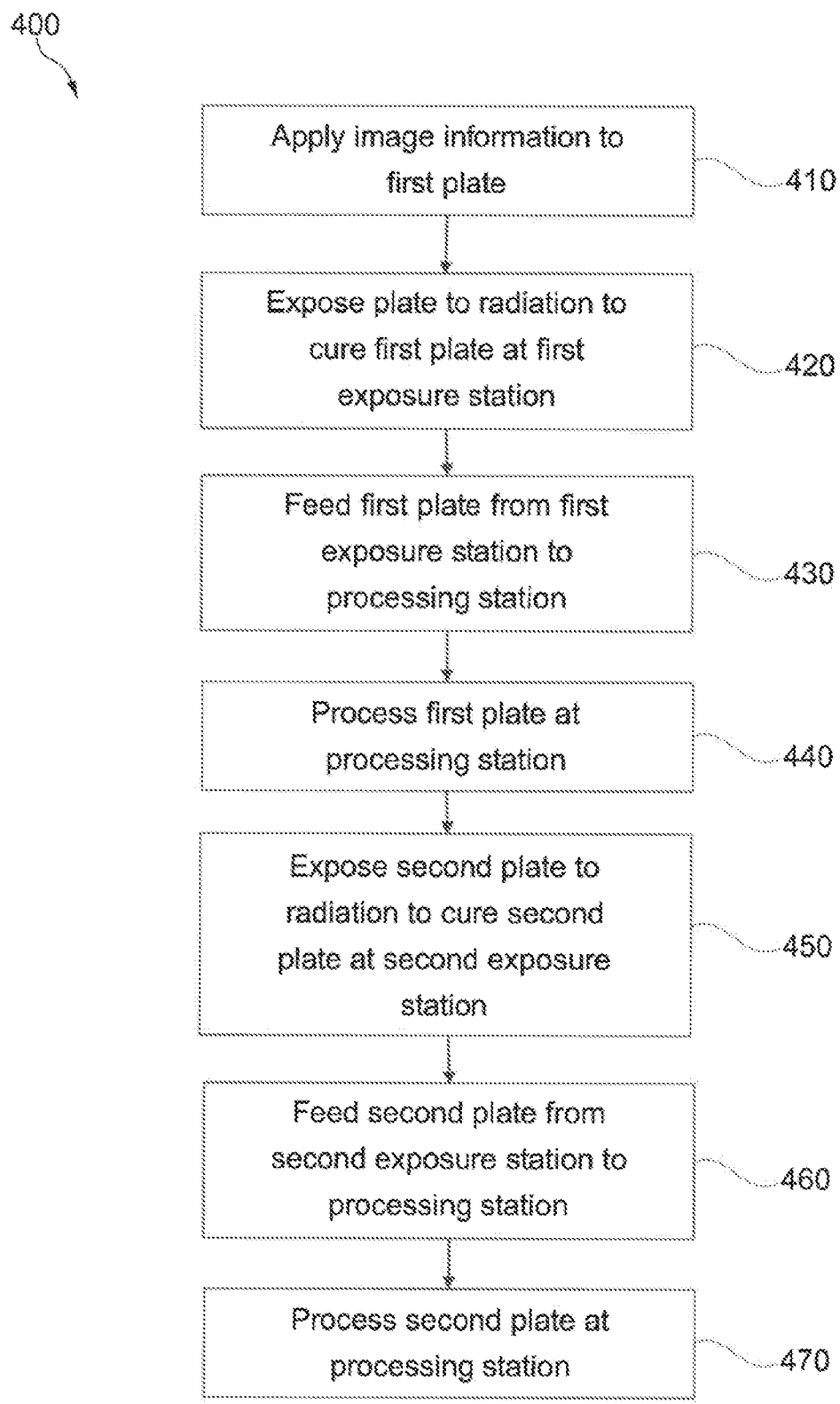
FIG. 4 is a block diagram depicting an example method for producing a flexographic printing plate.

An example process 400 for producing a flexographic printing plate is shown diagrammatically in FIG. 4. Process 400 generally includes feeding printing plates from multiple different exposure stations to a single processing station of a processing line. It should be understood that process 400 is not limited to any particular physical embodiment, and may be performed in any system having the physical configuration needed to perform the recited steps. Nonetheless, additional details of process 400 are set forth below and described with respect to the components of processing line 200.

In step 410, image information is applied to a first printing plate. In step 420, the imaged first plate is exposed to radiation to cure the plate at a first exposure station. In step 430, the cured first plate is fed from the first imaging station to a processing station. In step 440, the cured first plate is processed at the processing station.

In an example, imaging station 220 applies image information to a first is printing plate received from plate reservoir 210, as described above. The imaged first plate is transported to exposure station 230, where the plate is exposed to radiation to cure the plate. Feeding station 240 feeds the cured first plate from exposure station 230 to processing station 250. At processing station 250, the first plate is processed by applying one or more of water, a solvent, and/or a thermal process to the plate, as described above.

In step 450, a second plate is exposed to radiation to cure the second plate at a second exposure station different from the first exposure station. Step 450 is performing during step 440, i.e., during processing of the first plate at the processing station. In step 460, this second cured plate is fed from the second imaging station to the processing station after step 440. In step 470, the second cured plate is processed at the processing station.

In an example, another exposure station 230 exposes the second plate to radiation to cure the plate at the same time that the first plate is being processed by processing station 250. After processing the first plate by processing station 250, feeding station 240 feeds the second plate to processing station 250. At processing station 250, the second plate is then processed in the same manner described above. Notably, because the processing station typically requires less time to complete the processing therein than the imaging and exposure steps take to complete, the elapsed time between feeding the first plate and the second plate to the processor may be significantly less than the amount of time typically associated with an imaging or exposure step, and closer to the amount of processing time associated with the processing step completed by the processing station.

For example, a Vianord EVO processor is configured to accepted plates under certain conditions approximately every 8 minutes, whereas the exposure step for a given plate may be, on average, about 15 minutes. The imaging step also may typically take about 15-20 minutes. Thus, the imaging and exposure steps are generally matched in elapsed time required. In some cases, however, both the first and second imagers may start imaging and exposing the plates at the same time, and the plate which is finished first is fed to the processor. While exposure time for a given plates of similar type is generally constant, the imaging process may be more variable. For example, if there are many areas without image information in one job, the imager may be configured to skip such areas and thus shorten the imaging time. What is important is that the elapsed time between plates fed to the processor is generally less than the elapsed time required for imaging or exposure.

Figure 5:
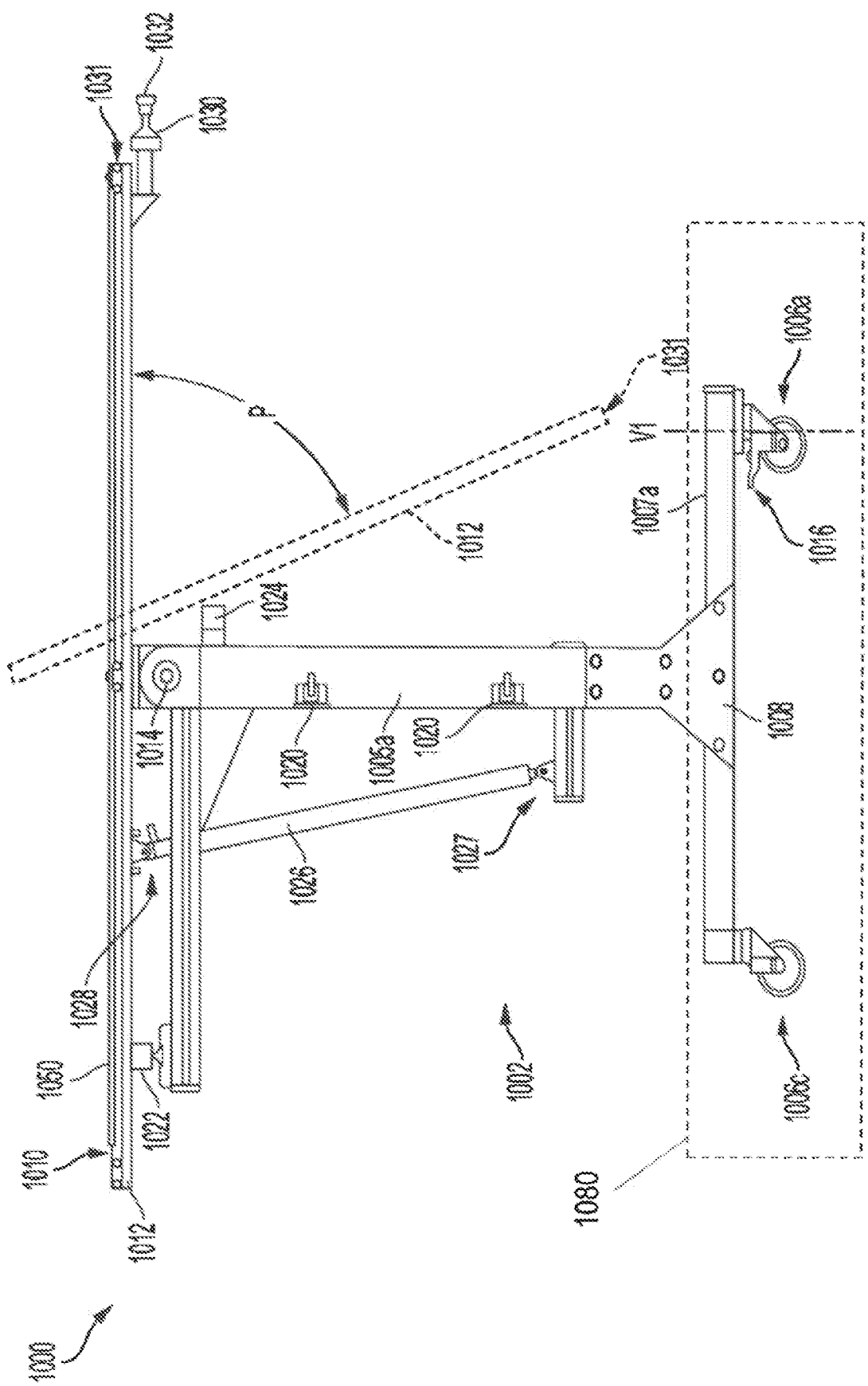
FIG. 5 is a schematic diagram of an example of a transportation cart for use in a plate processing line.

An exemplary transportation cart or carriage 1000 is depicted in FIG. 5 (similar to that shown in FIG. 7B in U.S. patent application Ser. No. 15/734,434). Carriage 1000 comprises a base 1002 having a frame and a plurality of wheels 1006*a*, 1006*c*, (third and fourth wheels not visible in the figure) attached to the frame and configured to roll along a floor surface. In the embodiment depicted in FIG. 5, the frame includes two vertical risers 1005 each attached to a horizontal wheel frame 1007, with opposite wheel frames connected to one another by a cross-brace 1009. Bracket 1008 connects each vertical riser 1005*a*, 1005*b* to a corresponding wheel frame 1007*a*, and brackets 1111 strengthen the connection between each wheel frame and cross-brace 1009. Planar preparation/loading surface 1010 for receiving plate 1050 includes a top frame 1012 pivotally attached to the vertical risers 1005 of the base frame via hinge 1014 (e.g. a barrel hinge mechanism), which is configured to facilitate pivoting of the planar preparation surface frame 1012 within a range of angles along arrow P between a first, horizontal position in which the plate preparation surface is parallel to the floor surface (depicted in solid lines) and a second maximum tilt position (depicted in dashed lines, with top portion cut off) in which the plate preparation surface is disposed at an acute angle relative to the first position.

One or more of the plurality of wheels may include a stop mechanism 1016 for arresting rotation of the wheel. A first pair of the plurality of wheels (e.g. wheel 1006*c* and another wheel (not shown) attached in the corresponding position to wheel frame 1007*b*), may be fixed to the frame in an orientation in which each wheel is configured to rotate about a first common horizontal axis (not shown) parallel to the floor. A second pair of the plurality of wheels (e.g. wheel 1006*a* and another wheel (not shown)) may be pivotally attached to the frame in orientations in which each wheel is configured to rotate about an independent horizontal axis (not shown) parallel to the floor and free to pivot about a second axis (e.g. V1) perpendicular to the floor.

Tilt functionality and associated mechanisms are optional, but when present, may facilitate movement of the cart throughout a facility, such as through narrow doorways. The exemplary mechanism as depicted in FIG. 5 includes a mechanism for moving the planar preparation surface between the horizontal position and the maximum tilt position. A first mechanical stop 1022 is positioned to restrict pivoting of the planar preparation surface beyond the range of angles when the top is in the horizontal position, and a second mechanical stop 1024 is configured to restrict pivoting of the planar preparation surface beyond the range of angles when the top is in the maximum tilt position. Each stop may comprise a member attached to the preparation surface frame 1012, to the base 1002, or a combination thereof. The stop preferably comprises a robust, cushioned member (e.g. real or synthetic rubber). A spring-damper member (e.g. a gas spring) 1026 has a first end 1027 connected to the base frame and a second end 1028 connected to the planar preparation surface frame. A handle 1030 connected to the planar preparation surface frame 1012 adjacent a front edge 1031 of the surface 1010 of is configured to permit a human user to manipulate the planar preparation surface between the horizontal position and tilted positions without a need for the user to contact the frame 1012. An actuator (knob 1032) has a first configuration (e.g. pushed in) for retaining the planar preparation surface from pivoting and a second configuration (e.g. pulled out) for releasing the planar preparation surface to permit pivoting.

Figure 6:
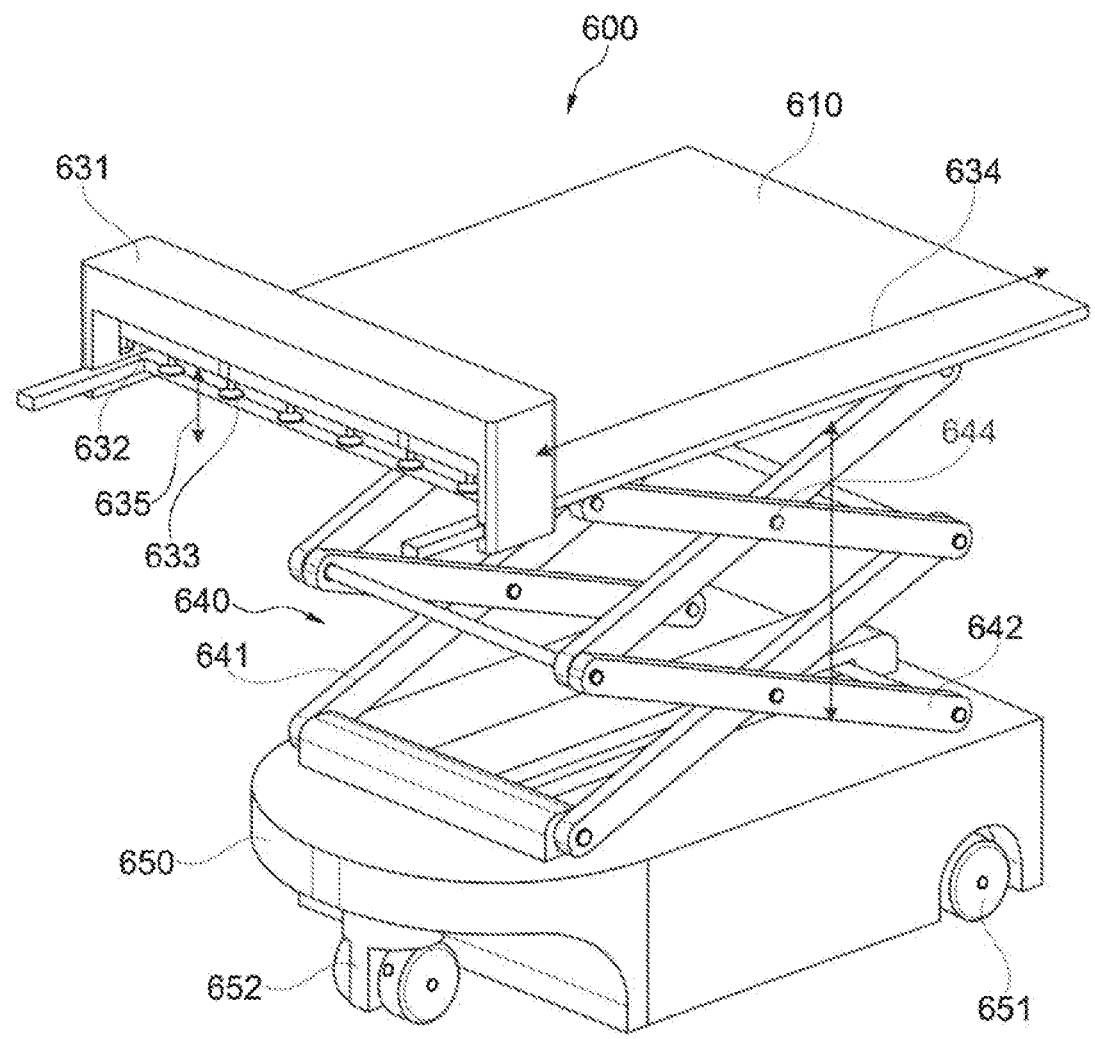
FIG. 6 is a schematic diagram of another example of a transportation cart for use in a plate processing line.

FIG. 6 depicts an autonomous plate cart embodiment 600 having a table 610 for receiving plates. The table is mounted on a lift 640, comprising a plurality of scissor actuators 641, 642, configured to permit adjustment of the height of the table in direction of arrow 644. Carriage 650 moves the table by means of two fixed wheels 651 and one rotate-able wheel 652, which may be the drive wheel, and facilitates steering the device along the predetermined path between the different processing stations. A traverse 631 on top of the table moveable in direction of arrow 634 carries a bar 632 equipped with suction caps 633. The bar can be moved up and down in direction of arrow 635 in order to grab plates from a reservoir and pull them onto the table by movement of the traverse along the table. The table may be wider than the carriage, with carriage sized to travel through any doorways or relatively narrow areas, and scissor actuators 641, 642 independently controllable such that actuation of only one, or one to a greater height than the other, is suitable for tilting the table to allow the table to pass through such doorways and other narrow areas.

The preparation table 600/1000 may have any number of additional functions and capabilities, not described herein, including having one or more communication ports (not shown) and may have a physical connection interface 2020 that affixes the carriage to the imager or to another part of the workflow system. Physical connection interface 1020 may also include an electrical connection to provide charging power to the table, which may have an onboard rechargeable power source, such as a battery (not shown) for powering specific additional functions of the table. Planar preparation/loading surface 1010/610 is configured to receive a flexographic printing plate 1050 for transport. In an example, planar preparation/loading surface 1010/610 is is configured to receive a plate from a station of processing line 200, such as exposure station 230, and deliver the plate on the planar preparation/loading surface 1010 to another station of processing line 200, such as processing station 250. In this example, planar preparation/loading surface 1010/610 is also configured to receive another plate from another exposure station of a separate processing line, and deliver the other plate on the planar preparation/loading surface 1010 to a station of processing line 200, such as processing station 250.

Planar preparation/loading surface 1010/610 may be configured to receive and hold multiple plates simultaneously, or may be configured to hold one plate at a time. In one example, planar preparation/loading surface 1010/610 may be configured to support a plate in a horizontal orientation by supporting a bottom surface of the plate. In another example, a preparation table may be provided with a loading portion configured to support a plate in a vertical orientation, e.g., by hanging a plate from one or more hooks, clips, or other fasteners, or may be configured to support a plate in at least some range of angles between vertical and horizontal in accordance with the tilt mechanism.

In the exemplary table depicted in FIG. 5, wheels (e.g. 1006a, 1006c) permit manual locomotion of the cart between various stations of a processing line, e.g., between one exposure station 230, another exposure station 230 (e.g. of a separate processing line), and processing station 250. Carriage 650 of cart 600 depicted in FIG. 6 may include any type of interface between the ground and the table (e.g. wheels, tracks, etc.) and may be powered, as described in further detail herein. It should be understood that the various locomotion subcomponents of cart will be different than those depicted in FIG. 6, consistent with locomotion systems known in the art in conformance with the functions as described below. Other portions of the cart may also differ from the exemplary cart 600 depicted in FIG. 6.

In embodiments, the cart 600 may be a robotic system that has a motor and transmission system for providing power and steering to the wheels, as well as a navigation system for controlling locomotion. In one embodiment, wheels 651/652 may be track wheels configured to engage corresponding rails (not shown) placed adjacent to or attached to plate processing line 200. In this embodiment, the cart may be guided by a system of rails embedded in or mounted to the floor or walls of a processing line. The track wheels may guide the movement of cart along these rails to predetermined stations along the line.

In another example, the cart may include radio frequency (RF) sensors configured to detect radio frequency signals for automatically navigating the cart along a is path. In this example, the path for cart 600 may be defined by RF signal emitters along the processing line. Processing line 200 may further include RF transmitters or beacons that can be used to identify predetermined stations along the line. Cart 600 may further include a controller as described above to process RF signals received by the RF sensors, and control movement of cart 600 based on the RF signals received.

In yet another example, the locomotion and navigation system of the cart may include optical sensors configured to detect optical signals for navigation. In this example, the pathway for the cart may be defined by optical or inductive marks in the facility floor or walls, or by laser light signals. Processing line 200 may further include infrared transmitters or beacons that can be used to identify predetermined stations along the line. Optical sensors may include cameras or photodetectors that detect visible light images for use in navigation. The cart may further include a controller as described above to process optical signals received by the sensors, and control movement of cart based on the optical signals received.

The various potential guidance devices (e.g., rails, RF signals, optical signals) of one processing line may be configured to communicate or interconnect with those of other processing lines, thereby allowing connections between processing liens in different areas of a facility. This may be particularly useful to transport cured plates from one processing line to a processing station on another processing line.

Examples

In flexography, there are three major standard plate sizes that may be used in a processing line as described herein: 48"×35", 42"×60", and 50"×80". These plates have a plate surface area of 1.1 $m^2$, 1.6 $m^2$, and 2.6 $m^2$. respectively.

In one example corresponding to a 50"×80" plate, the processing station needs between 5 and 10 minutes for processing the plate with a hydrocarbon solvent before another plate can be supplied. The intake sequence for a processing station using a hydrocarbon solvent is approximately 8 minutes. The feed of plates may be controlled so that plate type (e.g., thickness and size) is the same for each plate, such that there is no need to change processing parameters from one plate to another. With such control, the time interval for accepting the next plate can be even shorter than 8 minutes, and preferably, can result in a new plate being fed into the processing station as an earlier plate leaves the processing station. It will be understood, however, that not all processing stations must wait until a first plate is fully through the system to feed a second is thicker/thinner plate, as certain systems may be configured to continue processing an existing plate and automatically adjust for sizing of an incoming plate.

Imaging station productivity rates range between 6 and 10 m²/h. In this example, a 50"×80" plate format imager has approximately a 6 m²/h imaging speed, meaning the imaging station can process approximately three plates per hour. In addition to the sheer imaging time, approximately 2-3 minutes must be added for the automated loading and unloading of the plate into and from the imaging station (e.g., by a plate handler). Positioning the plates in the exposure station will likewise require additional time.

Exposure of a 50"×80" plate can last between 7 and 20 minutes. On average among commercially available plate types, curing of an entire plate takes about 15 minutes. With the related times for input and removal, an exposure station can cure the entire plate output of one imager for 50"×80" plates.

On average, the output from the imaging and exposure stations of an example processing line is 3-4 plates per hour. By contrast, the processing station can process between 6 and 8 plates per hour. Therefore, combining one processing station with two imaging/exposure stations results in a perfect match of processing workload to imagining/exposure workload, resulting in efficient processing with minimal downtime of the processing station. In a workflow where the same plate type is used for each plate being processed, the processor throughput can become even higher, because processing parameters need not be changed between plates.

Although in the example above a processing line for a 50"×8" plate is described, the same efficiencies and timing relationships will apply for systems designed for other plate sizes. Moreover, it may be possible to achieve benefits in processing efficiency by mixing plates having different sizes or thicknesses. Particular advantages may be achieved by configuring multiple imagers with different drum sizes (for holding different sized plates) feeding consolidated downstream processing in combination with a controller programmed with software that distributes print jobs on the plates to minimize the amount of plate surface without imaged content.

In a further example, the waiting time to insert identical 1.7 mm thick plates is 7 minutes, whereas the waiting time between 3.94 mm plates is 15 minutes. When processing a mixture of plates having these thicknesses, it may be possible (e.g. with a central computer) to arrange an order of feeding plates, e.g., in which multiple 1.7 mm is thick plates (e.g. two or three or four or more) are fed one after one to boost efficiency, rather than switching back and forth between 1.7 mm thick plates and 3.94 mm thick plates.

Although the invention is illustrated and described herein with reference to specific embodiments, the invention is not intended to be limited to the details shown. Rather, various modifications may be made in the details within the scope and range of equivalents of the claims and without departing from the invention.

While preferred embodiments of the invention have been shown and described herein, it will be understood that such embodiments are provided by way of example only. Numerous variations, changes and substitutions will occur to those skilled in the art without departing from the spirit of the invention. Accordingly, it is intended that the appended claims cover all such variations as fall within the spirit and scope of the invention.

What is claimed:

1. A plate processing line for producing a flexographic printing plate comprising:
    an imaging station configured to apply image information to a first plate;
    a first exposure station configured to expose the first plate to radiation to cure the first plate;
    a processing station configured to process the first plate by applying one or more of water, a solvent, and/or a thermal process to the first plate;
    at least one further station selected from a group consisting of a drying station configured to dry the first plate and an after-exposure station configured to expose the first plate to further radiation; and
    a feeding station configured to feed the first plate cured by the first exposure station from the first exposure station directly to the processing station, wherein the feeding station is further configured to feed a second plate cured by a second exposure station from the second exposure station directly to the processing station.

2. The plate processing line according to claim 1, wherein the feeding station is configured to accept printing plates from two or more exposure stations.

3. The plate processing line according to claim 1, wherein the first and second exposure stations are configured to handle different plate sizes.

4. The plate processing line according to claim 1, wherein the feeding station comprises one or more conveyer belts configured to transport the first plate between the first exposure station and the processing station.

5. The plate processing line according to claim 1, wherein the feeding station comprises one or more robotic arms configured to transport the first plate between the first exposure station and the processing station.

6. The plate processing line according to claim 1, wherein the feeding station comprises one or more transportation carts configured to transport the first plate between the first exposure station and the processing station.

7. A transportation cart for use in a plate processing line for producing a flexographic printing plate, the transportation cart comprising a transport system for moving the transportation cart between a first exposure station, a second exposure station, and a processing station of the plate processing line, the transportation cart configured to: (a) receive a first plate from the first exposure station and deliver the first plate from the first exposure station directly to the processing station, and (b) receive a second plate from the second exposure station and deliver the second plate from the second exposure station directly to the processing station.

8. The transportation cart of claim 7, wherein the transport system comprises one or more of:
    track wheels configured to engage corresponding rails;
    radio frequency sensors configured to detect radio frequency signals for navigation; and
    optical sensors configured to detect visual signals for navigation.

9. A plate processing line for producing a flexographic printing plate comprising:
    an imaging station configured to apply image information to the plate;
    a first exposure station configured to expose the plate to radiation to cure the plate;

a processing station configured to process the plate by applying one or more of water, a solvent, and/or a thermal process to the plate;

at least one further station selected from a group consisting of a drying station configured to dry the plate and an after-exposure station configured to expose the plate to further radiation;

a plate transportation means configured to transport the plate between respective ones of the stations, the plate transportation means configured to transport a first plate from the first exposure station directly to the processing station and further configured to transport a second plate from a second exposure station directly to the processing station; and a central computer in communication with each of the stations and the plate transportation means, the central computer configured to coordinate operation of each of the stations and the transportation means to effect the producing of the flexographic printing plate.

10. The plate processing line of claim 9, wherein the central computer is configured to control the plate transportation means to group printing plates having a same thickness in sequence with one another, in order to expedite processing.

11. The plate processing line of claim 9, further comprising at least one plate reservoir.

12. The plate processing line of claim 11, wherein the plate transportation means are configured to transport plates from a plate reservoir to the imaging station.

13. The plate processing line of claim 9, comprising more than two imaging stations and at least two processing stations.

14. A plate processing method for producing a flexographic printing plate comprising:

applying image information to a first plate;

exposing the plate to radiation to cure the first plate at a first exposure station;

feeding the first plate from the first exposure station directly to a processing station;

processing the first plate at the processing station by applying one or more of water, a solvent, and/or a thermal process to the first plate;

exposing a second plate to radiation to cure the second plate at a second exposure station during the processing of the first plate at the processing station;

feeding the second plate from the second exposure station directly to the processing station following the processing of the first plate; and processing the second plate at the processing station by applying one or more of water, the solvent, and/or the thermal process to the second plate.

15. The plate processing method of claim 14, wherein the first plate and the second plate have a same size and surface area.

16. A plate processing method for producing a flexographic printing plate, the method comprising the sequential steps of:

a) applying image information to a first plate at a first imaging station;

b) exposing the first plate to radiation to cure the first plate at a first exposure station;

c) feeding the first plate from the first exposure station directly to a first processing station;

d) processing the first plate by applying one or more of water, a solvent, and/or a thermal process to the first plate at the first processing station;

e) drying the first plate, exposing the first plate to further radiation, or a combination thereof at one or more further stations; and f) feeding a second plate cured by a second exposure station directly to the first processing station.

17. The method of claim 16, wherein the step of feeding the second plate comprises manually feeding the second plate.

18. The method of claim 16, wherein the step of feeding the second plate comprises automatically feeding the second plate.

19. The method of claim 16, further comprising feeding a third plate cured by the first exposure station to a second processing station.

20. The method of claim 16, wherein the second plate has a different size, thickness, or a combination thereof.

21. The method of claim 20, comprising distributing a print job between the first plate and the second plate to minimize an amount of plate surface without content corresponding to a finished printing plate or plate patch.

22. The method of claim 16, comprising processing a plurality of jobs on a plurality of plates of a same size, including at least one plate having a higher priority job than at least one other job on at least one other plate, including processing the plate with the at least one higher priority job before of the at least one other plate with the at least one other job.

23. The method of claim 22, further comprising combining at least one lower priority job with the at least one higher priority job on the same at least one plate to minimize plate waste.

* * * * *